(12) United States Patent
Gayne et al.

(10) Patent No.: US 8,380,106 B2
(45) Date of Patent: Feb. 19, 2013

(54) CENTER-REFERENCED PHOTOCONDUCTOR BEARING PLATE AND ASSEMBLY FOR ELECTRO-PHOTOGRAPHIC CARTRIDGE

(75) Inventors: Jarrett Clark Gayne, Lexington, KY (US); David Keith Schattner, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 276 days.

(21) Appl. No.: 12/827,775

(22) Filed: Jun. 30, 2010

(65) Prior Publication Data

US 2012/0003004 A1    Jan. 5, 2012

(51) Int. Cl.
*G03G 15/00* (2006.01)
(52) U.S. Cl. ....................................................... 399/117
(58) Field of Classification Search ................... 399/117
See application file for complete search history.

(56) References Cited

U.S. PATENT DOCUMENTS

| | | |
|---|---|---|
| 5,457,520 A | 10/1995 | Schell et al. |
| 5,729,792 A | 3/1998 | Ikehara |
| 6,249,661 B1 | 6/2001 | Saitoh et al. |
| 6,519,431 B1 | 2/2003 | Toba et al. |
| 7,272,342 B2 | 9/2007 | Nagashima et al. |
| 7,493,061 B2 * | 2/2009 | Hatori et al. ................... 399/111 |
| 7,734,219 B2 | 6/2010 | Tanaka et al. |
| 2006/0051131 A1 * | 3/2006 | Takigawa ....................... 399/159 |
| 2008/0205932 A1 | 8/2008 | Koyama |
| 2009/0110434 A1 * | 4/2009 | Kusudo et al. ................. 399/109 |

OTHER PUBLICATIONS

International Search Report and Written Opinion of the International Searching Authority for PCT Application No. PCT/US2011/042710 dated Nov. 1, 2011 (7 pages).

* cited by examiner

*Primary Examiner* — Ryan Walsh
(74) *Attorney, Agent, or Firm* — Justin M Tromp; John Victor Pezdek

(57) ABSTRACT

A bearing plate for rotatably supporting a photoconductor drum having a center shaft according to one exemplary embodiment includes a body having a first side, a second side, and an edge surface between the first and second sides. A center hole extends through the body for rotatably receiving an end of the center shaft and positionally referencing an outer surface of the photoconductor drum to a center axis of the center hole. A support arm extends from the body in a non-radial direction. The support arm has a mounting surface for receiving an additional component positionally referenced to the center axis. An assembly for use in an image forming device according to one embodiment includes a photoconductor drum having a center shaft and a pair of substantially identical bearing plates mounted on opposite ends of the photoconductor drum. The bearing plates are translated from one another and have identical orientations.

16 Claims, 8 Drawing Sheets

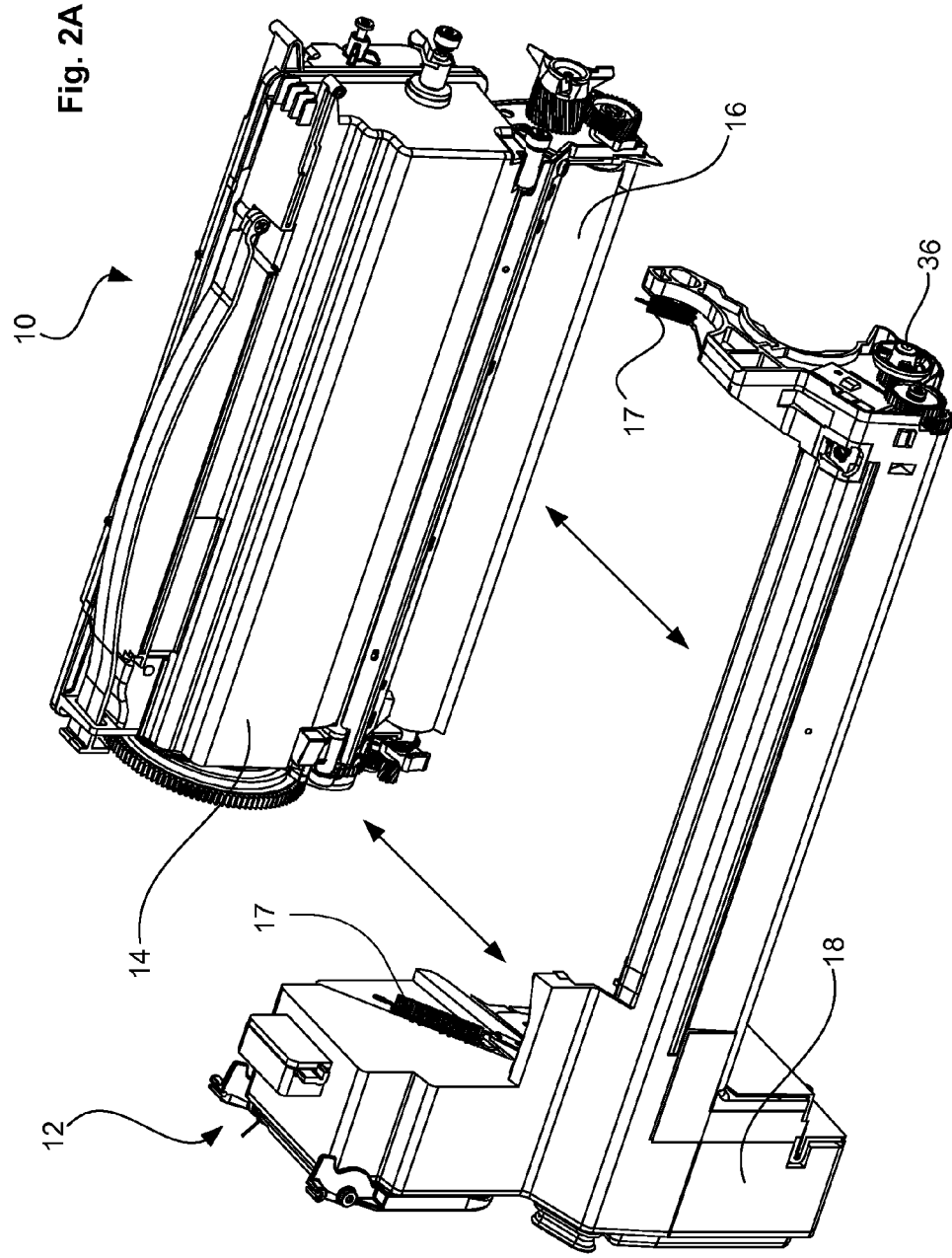

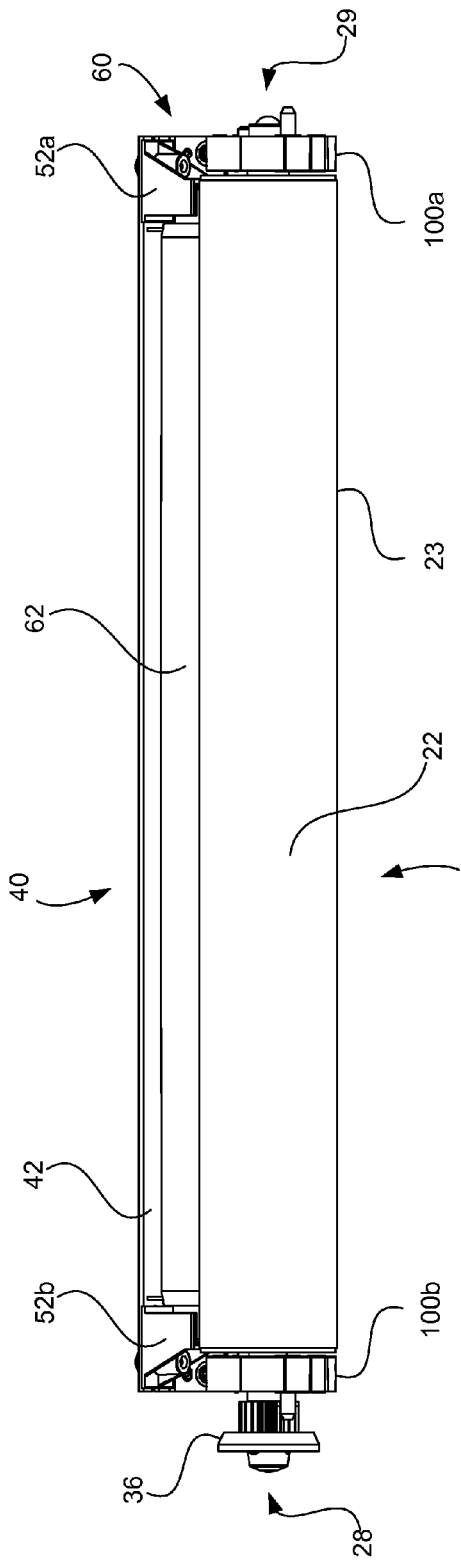
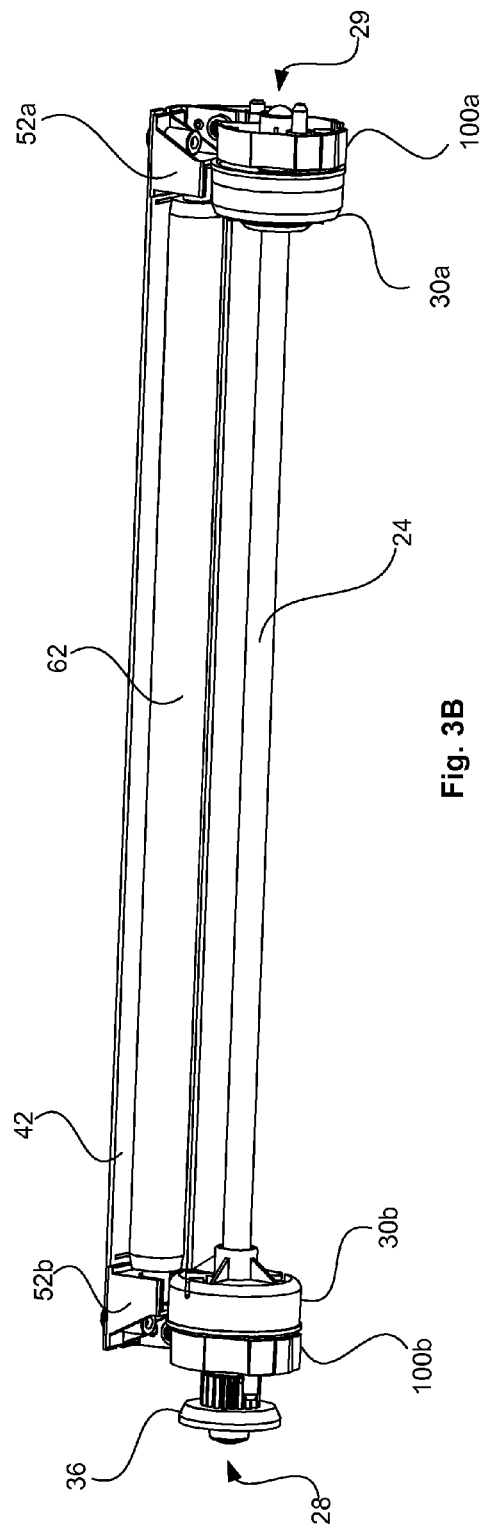

CENTER-REFERENCED PHOTOCONDUCTOR BEARING PLATE AND ASSEMBLY FOR ELECTRO-PHOTOGRAPHIC CARTRIDGE

CROSS REFERENCES TO RELATED APPLICATIONS

None.

STATEMENT REGARDING FEDERALLY SPONSORED RESEARCH OR DEVELOPMENT

None.

REFERENCE TO SEQUENTIAL LISTING, ETC.

None.

BACKGROUND

1. Field of the Invention

The present invention relates generally to an assembly for use in an electro-photographic image forming device and, more particularly, to a bearing plate for rotatably supporting a photoconductor drum in the assembly.

2. Description of the Related Art

In a typical in-line color electro-photographic imaging process, latent images are formed on one or more photoconductor drums, which are in turn each developed using a predetermined color of toner. A color image forming device may include a plurality of photoconductor drums, each corresponding with a desired color, for example, black, magenta, cyan and yellow. Each toner color forms an individual image of a single color that is combined in layered fashion to create the final multi-colored image. A mono electro-photographic image forming device typically includes at least one photoconductor drum. The developed images are transferred from the photoconductor drum(s) to a toner receiving surface such as an intermediate transfer medium or a media sheet (such as paper) that travels past the photoconductor drum(s).

The photoconductor drum(s) include a drum body and support members, such as bearing plates. The drum body has a hollow tubular shape. The support members rotably support the outer peripheral surface of the photoconductor drum body. Typically, the photoconductor drum rides inside a thin plastic wear strip or cap bearings that are mounted in a mirror-image fashion on each end of the photoconductor drum. The bearing plates sit in a V-notch block positioned adjacent each end of the photoconductor drum.

In this configuration, an out-of-round photoconductor drum can cause AC process print registration problems. These registration problems may be caused by positional error of a cartridge station relative to another cartridge station in the photoconductor drum's process direction. Registration problems may also be caused by sinusoidal motion of an out-of-round photoconductor drum resulting from the drum not being restrained as it rides upon the leading and trailing sides of the V-notch block.

In this configuration, the bearing plates possess bi-lateral or mirror-image symmetry with respect to one another and are installed on each end of the photoconductor drum, magnifying the effect of any dimensional error in the bearing. Further, the photoconductor drum, the charge roller, and the cleaner blade are mounted to a cleaner housing, a large plastic part with poor dimensional accuracy. Dimensional variations between electro-photographic components, for example, between each bearing plate, may cause skew between the media sheet and the photoconductor drum(s) as well as cartridge-to-cartridge variation such that, for example, a first color toner image will be shifted from a second color toner image. Accordingly, it will be appreciated that an assembly is needed that decreases the variation between electro-photographic components to decrease the occurrence of skew and increase dimensional control.

SUMMARY OF THE INVENTION

A bearing plate according to one exemplary embodiment includes a body having a first side, a second side, and an edge surface between the first and second sides. A center hole extends through the body to rotably receive an end of a center shaft of a photoconductor drum and to positionally reference an outer surface of the photoconductor drum to a center axis of the center hole. A support arm extends from the edge surface in a non-radial direction. The support arm has a mounting surface to receive an additional component positionally referenced to the center axis. In some embodiments, an alignment device is disposed on the mounting surface of the support arm for cooperatively engaging with the additional component and aligning the additional component to the center axis. Embodiments include those wherein an upper section of the body includes a notch in the edge surface adjacent to the support arm. The notch has a floor that forms an obtuse angle with the mounting surface of the support arm.

In some embodiments, a first positioning surface and a second positioning surface extend radially from the edge surface of the bearing plate. The positioning surfaces position the bearing plate on a V-notch mounting block relative to a toner receiving surface. Embodiments include those wherein the first positioning surface and the second positioning surface are arcuate and defined by a radius from the center axis of the center hole and are positionally referenced to the center axis. Each positioning surface has substantially no draft across a width of the positioning surface. In a preferred embodiment, a radial distance from the center axis to each of the first positioning surface and the second positioning surface is about 15.5 mm.

Embodiments include those wherein a boss extends from the first side of the body adjacent to the center hole. In some embodiments, a cutout in the boss orthogonal to the center hole allows a cross pin to be inserted into a corresponding radial hole through the center shaft. Additional embodiments include a cutout in the edge surface orthogonal to the center hole that allows the cross pin to be inserted into the radial hole. A plurality of guide members aligned between the cutout in the edge surface and the cutout in the boss and extending from the first side of the body may also be used to direct the cross pin toward the radial hole.

An assembly for use in an image forming device according to one exemplary embodiment includes a photoconductor drum having a center shaft and a pair of substantially identical bearing plates mounted on opposite ends of the photoconductor drum. The center shaft has a radial hole therein adjacent to an end of the center shaft. The bearing plates are translated from one another and have substantially identical orientations. Each bearing plate has a center hole therein for rotably receiving a respective end of the center shaft and positionally referencing an outer surface of the photoconductor drum to a center axis extending between the center of each center hole and along the centerline of the center shaft. A pin is inserted through the radial hole between an end of the photoconductor drum and the adjacent bearing plate.

Embodiments include those wherein a charge roller having a center shaft is mounted to the support arms of the bearing plates. The charge roller extends axially across the photoconductor drum and has an outer surface in contact with the outer surface of the photoconductor drum for electrically charging the outer surface of the photoconductor drum. Additional embodiments include a cleaner blade mounted to the support arms of the bearing plates. The cleaner blade extends axially across the photoconductor drum and is biased against the outer surface of the photoconductor drum to remove toner from the outer surface of the photoconductor drum. In some embodiments, a bracket is mounted to the mounting surface of each support arm. The charge roller is mounted to the bracket and the cleaner blade extends from the bracket toward the photoconductor drum. An alignment device on the mounting surface of each support arm cooperatively engages with a respective end of the bracket to position the charge roller and the cleaner blade relative to the center axis of the center shaft of the photoconductor drum. In some embodiments, the assembly includes a pair of spring loaded retaining members. Each retaining member is mounted on a respective end of the bracket and receives a respective end of the center shaft of the charge roller. The retaining members bias the charge roller against the photoconductor drum.

Embodiments include those wherein a first radial distance from the center axis of the center shaft of the photoconductor drum to an edge of the cleaner blade in contact with the outer surface of the photoconductor drum is less than a second radial distance from the center axis of the center shaft of the photoconductor drum to the outer surface of the photoconductor drum when no contact exists. Further, a third radial distance from the center axis of the center shaft of the photoconductor drum to an adjacent surface of the toner receiving surface in contact with the outer surface of the photoconductor drum is less than the second radial distance when no contact exists.

In one preferred embodiment, the first radial distance is about 13.77 mm when no contact exists between the edge of the cleaner blade and the photoconductor drum. The second radial distance is about 15 mm. The third radial distance is less than about 15 mm when no contact exists between the toner receiving surface and the photoconductor drum. A fourth radial distance from the center axis of the center shaft of the photoconductor drum to a center axis of the center shaft of the charge roller is about 20.91 mm.

BRIEF DESCRIPTION OF THE DRAWINGS

The above-mentioned and other features and advantages of the various embodiments of the invention, and the manner of attaining them, will become more apparent and will be better understood by reference to the accompanying drawings, wherein:

FIGS. 2A and 2B are perspective views of a pair of toner cartridge assemblies that join to form a toner cartridge according to one embodiment of the present invention;

FIG. 3A is a perspective view of a cleaner assembly and a charge roller assembly mounted to a photoconductor drum assembly according to one embodiment of the present invention;

FIG. 3B is the assembly shown in FIG. 3A with the photoconductor drum body removed;

DETAILED DESCRIPTION

Figure 1A:
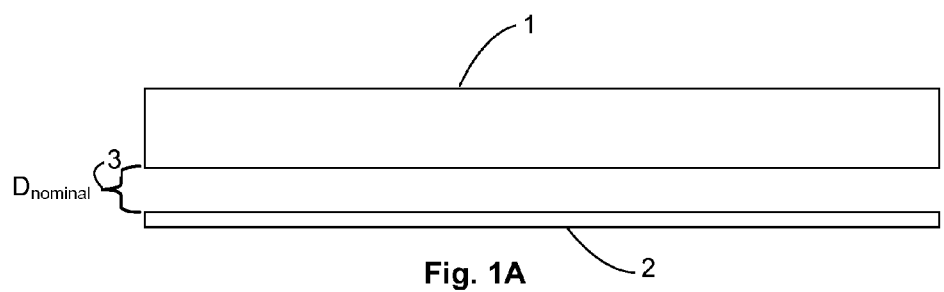
FIGS. 1A-1C are diagrammatic top plan views illustrating skew and offset between a toner receiving surface and a photoconductor drum.

The following description and drawings illustrate embodiments of the invention sufficiently to enable those skilled in the art to practice it. It is to be understood that the invention is not limited in its application to the details of construction and the arrangement of components set forth in the following description or illustrated in the drawings. The invention is capable of other embodiments and of being practiced or of being carried out in various ways. For example, other embodiments may incorporate structural, chronological, electrical, process, and other changes. Examples merely typify possible variations. Individual components and functions are optional unless explicitly required, and the sequence of operations may vary. Portions and features of some embodiments may be included in or substituted for those of others. The scope of the invention encompasses the appended claims and all available equivalents. The following description is, therefore, not to be taken in a limited sense, and the scope of the present invention as defined by the appended claims.

Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. In addition, the terms "connected" and "coupled" and variations thereof are not restricted to physical or mechanical connections or couplings.

Figure 1B:
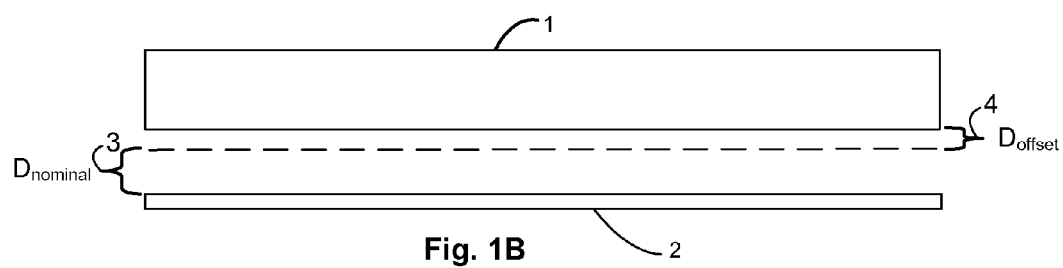
Figure 1C:
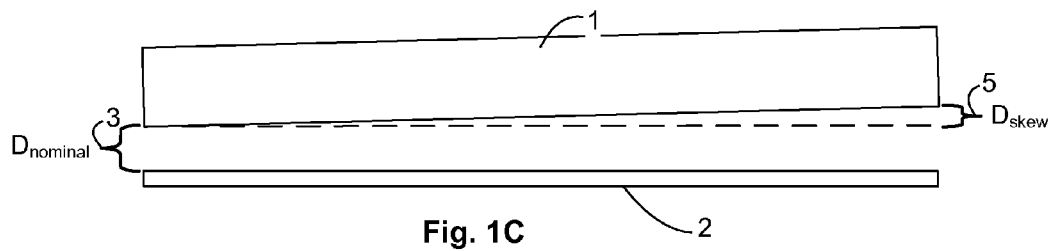

FIGS. 1A-1C illustrate an exaggerated diagrammatic top plan view of the problem that the present invention corrects. In FIG. 1A, nominal distance 3, $D_{nominal}$, between a parallel photoconductor drum 1 and toner receiving surface 2 in optimal alignment is shown. In this figure, neither skew nor offset is present. In FIG. 1B, offset is illustrated.

The photoconductor drum 1 and toner receiving surface 2 remain parallel to one another but at a distance 4, $D_{offset}$ other than $D_{nominal}$. Offset can be positive (i.e. the photoconductor drum is closer to the toner receiving surface than $D_{nominal}$) or negative (the photoconductor drum is farther away than $D_{nominal}$). Negative offset is illustrated. Offset of the photoconductor drum 1 causes each line of print to be offset by distance $D_{offset}$ from its desired location. In the case of a color electro-photographic image forming device, offset of one photoconductor drum 1 causes misplacement of the corresponding toner color corresponding thereby resulting in errors in the final multi-colored image. In FIG. 1C, skew 5, $D_{skew}$ is illustrated. Skew occurs when the photoconductor drum 1 is not parallel to toner receiving surface 2. As shown, photoconductor drum 1 is angled at its right end away from toner receiving surface 2. Skew of the photoconductor drum 1 causes each line of print to be angled from its desired orientation. In the case of a color electro-photographic image forming device, skew of one photoconductor drum 1 results in angled placement of the corresponding toner color relative to the toner receiving surface 2 thereby causing errors in the final multi-colored image.

With reference to FIG. 2A, an exemplary embodiment of a toner cartridge for an image forming device is shown. A first toner cartridge assembly 10 has a toner reservoir 14 therein. A developer roller 16 is mounted in toner cartridge assembly 10. FIG. 2B shows a second toner cartridge assembly 12. The toner cartridge assembly 12 houses a photoconductor drum assembly, a charge roll assembly and a cleaner blade assembly (FIG. 3). Cartridge assembly 10 and cartridge assembly 12 are coupled together such as by springs 17 to form a toner cartridge for housing and transferring toner to a toner receiving surface. In operation, the charge roller charges the photoconductor. A scanning laser beam discharges the charged photoconductor surface and creates a latent image on the outer surface of the photoconductor. The developer roller 16 transfers charged toner from the toner reservoir 14 to the photoconductor drum to form a toned image on the surface of the photoconductor drum. The toned image is then transferred to a toner receiving surface, such as a sheet of media or an intermediate transfer member such as a endless belt. After the toned image is transferred, a cleaning blade, cleaning brush or cleaning roller cooperatively mounted with the photoconductor drum removes residual toner on the photoconductor drum surface. Excess toner is transferred to a waste toner reservoir 18.

Figure 4:
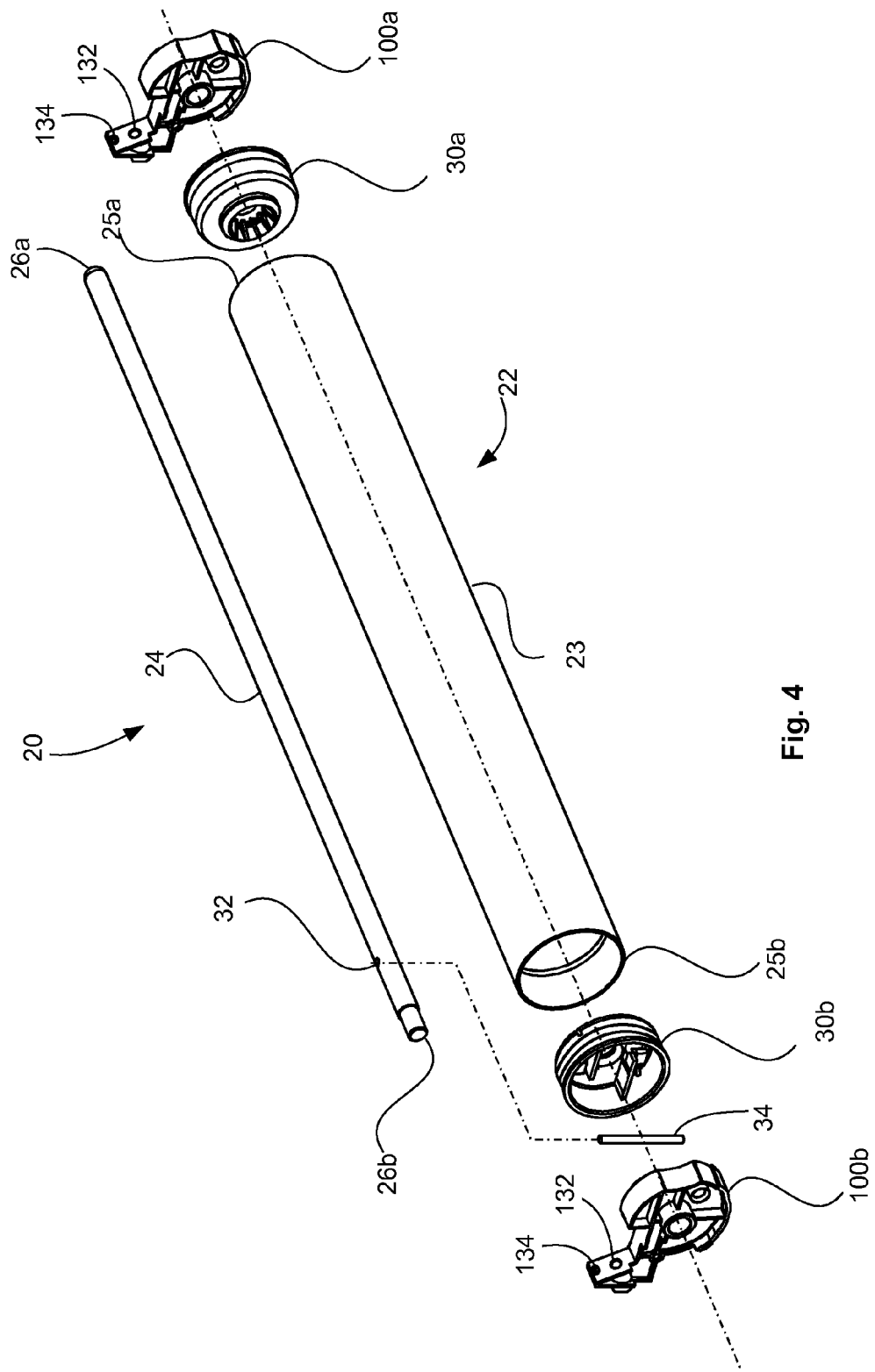
FIG. 4 is an exploded view of a photoconductor drum assembly according to one embodiment of the present invention.

Referring to FIGS. 3-4, a cleaner assembly 40 and a charge roller assembly 60 are shown mounted to a photoconductor drum assembly 20 according to one embodiment. Embodiments include those wherein the photoconductor drum assembly 20 includes a cylindrical drum body 22 having an outer surface 23 and mounted on a center shaft 24. FIG. 3B illustrates the photoconductor drum 20 with the drum body 22 removed to reveal the shaft 24. The shaft 24 includes a rounded head end 26a and a tail end 26b. The photoconductor drum 20 has a driven end 28 where it receives rotational force from a motor within the imaging apparatus and a non-driven end 29. End caps 30a, 30b are inserted into opposite ends 25a, 25b of the drum body 22. Each end cap 30a, 30b has a center opening for receiving shaft 24 therethrough. The end caps 30a, 30b may be flush-mounted with ends 25a, 25b of drum body 22. Alternatives include those wherein mounting flanges or other positioning devices are disposed about the outer circumference of each end cap 30a, 30b that abuts the respective end 25a, 25b of the drum body 22. End caps 30a, 30b are press fit into the ends 25a, 25b of drum body 22 so that drum body 22 does not rotate on end caps 30a, 30b. Rather, drum body 22 and end caps 30a, 30b rotate as a unit. Drum body 22 with end caps 30a, 30b is positioned between a pair of bearings plates 100a, 100b. Head end 26a of shaft 24 passes through a center hole in bearing plate 100b, through end cap 30b, drum body 22, end cap 30a, and bearing plate 100a. A radial mounting hole 32 is provided in shaft 24 adjacent to tail end 26b. The radial mounting hole 32 is inboard of, but spaced away from, the bearing plate 100b. A pin 34 is inserted through mounting hole 32 between end cap 30b and bearing plate 100b to attach the shaft 24 to the photoconductor body 22 and the end caps 30a, 30b. Pin 34 is received in snaps provided in the outboard face of end cap 30b that align with mounting hole 32. The shaft 24 is also supported on at least one end 26a, 26b by the housing of the second toner cartridge assembly 12. A driven gear 36 for receiving rotational force is mounted on the tail end 26b of shaft 24 outboard of the bearing plate 100b.

The bearing plates 100a, 100b are substantially identical to one another. The bearing plates 100a, 100b are translated from one another and have substantially identical orientations on each end of the photoconductor drum 20, unlike prior art assemblies where the bearing plates have mirror image symmetry with respect to one another. In this translated configuration, any dimensional error present in the bearing plates 100a, 100b is manifested as offset which can be compensated for through timing of the image transfer. With mirror symmetry dimensional errors can manifest as skew which cannot be compensated for through timing of the image transfer. The bearing plates 100a, 100b are each preferably composed of precision engineering-grade plastic; however, any suitable material may be used.

Figure 5A:
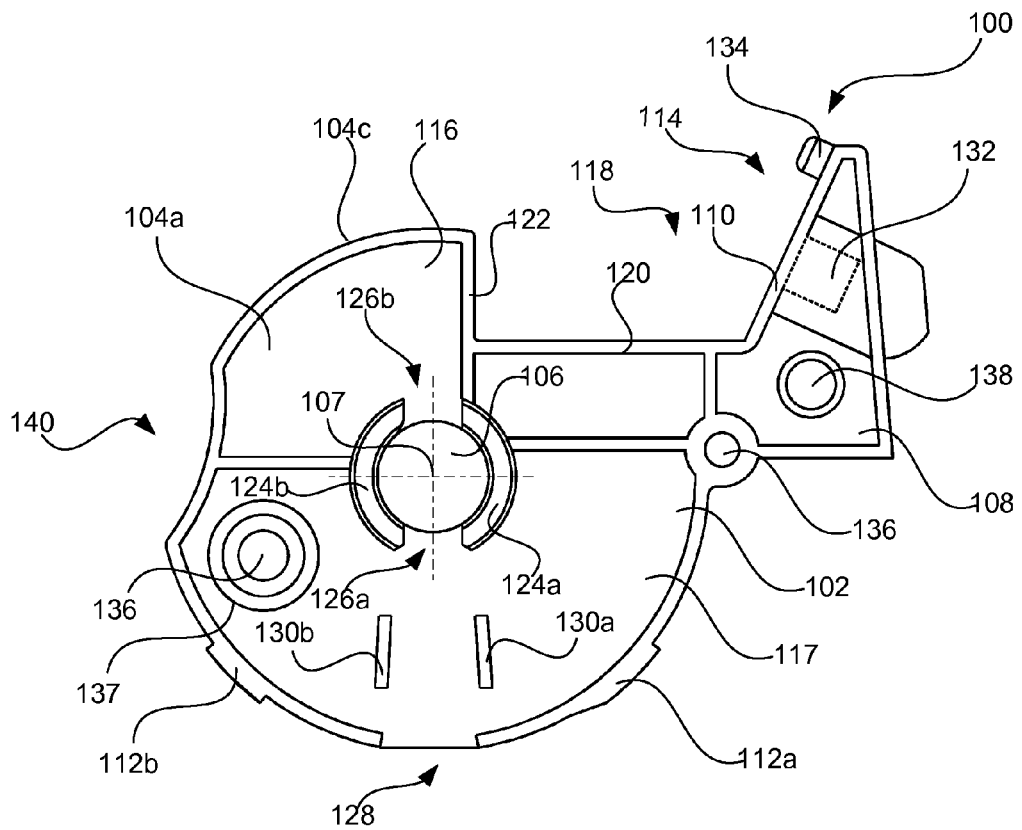
FIGS. 5A and 5B are side elevation views of opposite sides of a bearing plate according to one embodiment of the present invention.
Figure 5B:
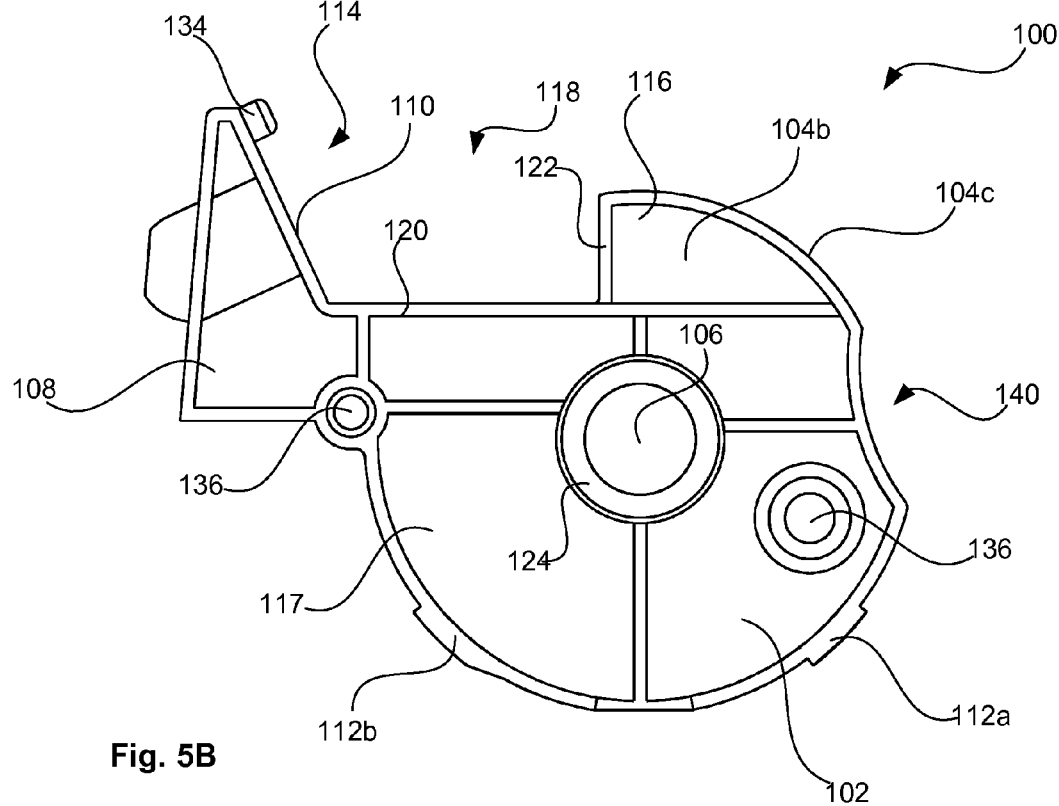

FIGS. 5A and 5B illustrate an exemplary embodiment of bearing plate 100 in greater detail. The bearing plate 100 includes a body 102 having a first side 104a, a second side 104b and an edge surface 104c formed between the first and second sides 104a, 104b. A center hole 106 extends through the body 102 for rotably receiving an end of the center shaft 24 of the photoconductor drum 20. The center hole 106 positionally references the outer surface 23 of the photoconductor drum 20 to a center axis 107 of the center hole 106 which is also the center axis 38 of center shaft 24.

Some embodiments include a boss 124 that extends from both sides 104a, 104b of the bearing 100 adjacent to the center hole 106. The boss 124 may encircle the center hole 106 and extend axially outward from both sides 104a and 104b. Alternatively, the boss 124 may include at least one cutout therein orthogonal to the center hole 106. In the exemplary embodiment shown, the boss 124 on side 104a includes two cutouts 126a, 126b thereby forming two arcuate boss portions 124a, 124b. In some embodiments, the cutout is positioned to allow the pin 34 to be inserted into the corresponding radial hole 32 through the center shaft 24. Embodiments include those wherein at least one additional hole 136 extends through the body 102 for receiving a shaft or protrusion such as, for example, a protrusion from a support bracket or a screw. The additional hole 136 may have a corresponding boss 137 that extends from one or both of sides 104a, 104b. Further, embodiments include those wherein a protrusion or nub 138 extends from the first side 104a of the body for mating with a hole or recess in an adjacent component.

A support arm 108 extends from the edge surface 104c in a non-radial direction. The support arm defines a mounting surface 110 for receiving an additional component that is positionally referenced to the center axis 107 of the center hole 106. In some embodiments, an alignment device 114 is disposed on the mounting surface 110 for cooperatively engaging with the additional component and aligning the additional component to the center axis 107. In the exemplary embodiment shown, the alignment device 114 includes a screw hole 132 for receiving a screw to attach the additional component and also includes a peg 134 protruding from the mounting surface 110 for mating with a hole or recess in the mounting means for the additional component. Body 102 includes an upper section 116 and a lower section 117. Embodiments include those wherein the upper section 116 of the body 102 includes a notch 118 formed in the edge surface 104c adjacent to the support arm 108. The notch 118 has a floor 120. In some embodiments, the floor 120 of the notch 118 and the mounting surface 110 form an obtuse angle therebetween. In the exemplary embodiment illustrated in FIG. 5A, the notch 118 takes the form of an L-shaped notch formed by the floor 120 and an adjacent side wall 122. In some embodiments, the body 102 includes an additional cutaway or notch 140 opposite the support arm 108 for providing clearance to accommodate an adjacent component.

Figure 8:
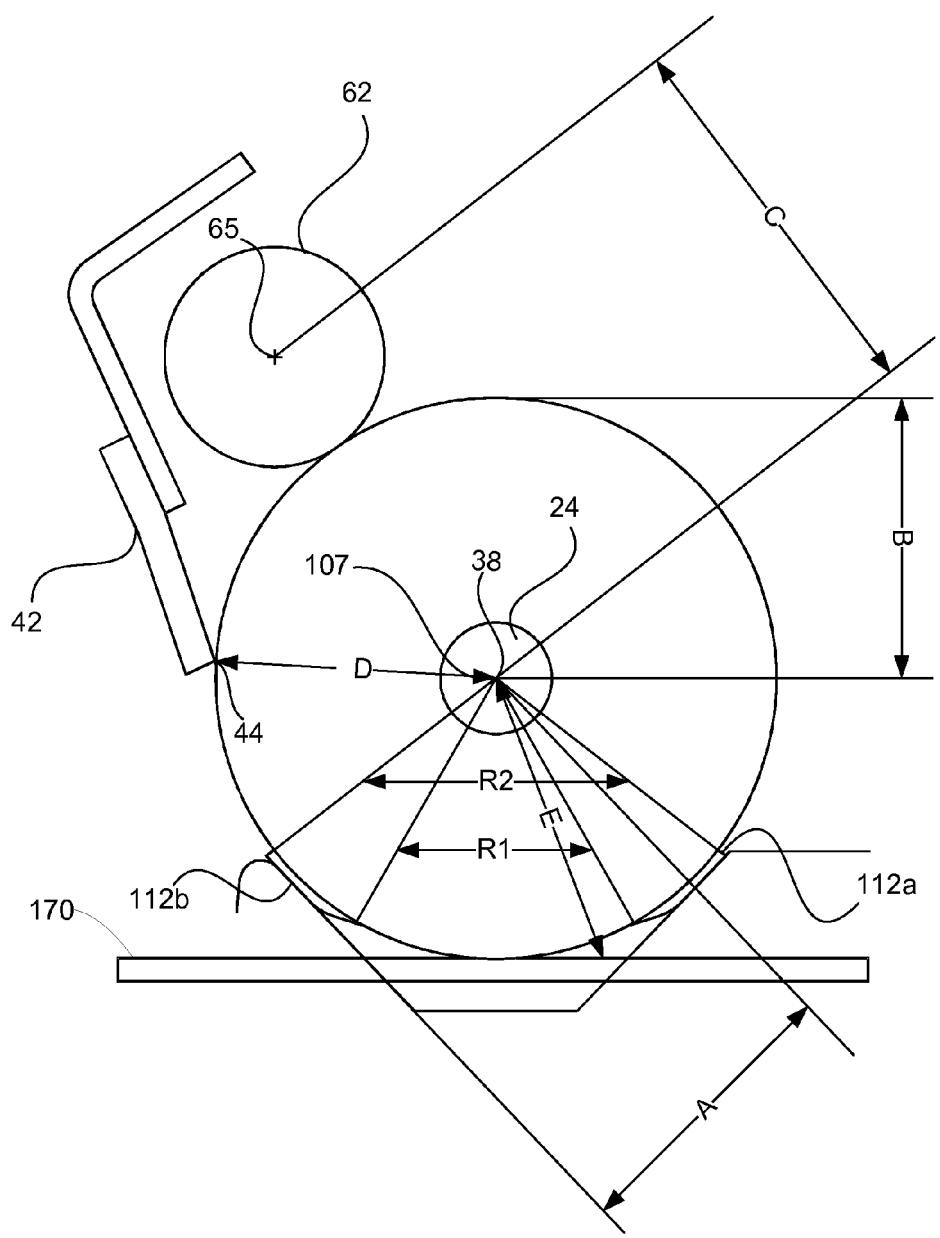
FIG. 8 is a schematic view of an assembly for use in an image forming device according to one embodiment of the present invention illustrating the positional referencing of various components relative to a center axis of a center shaft of a photoconductor drum.

Embodiments include those wherein a pair of positioning surfaces 112a, 112b extend radially from the edge surface 104c. The positioning surfaces 112a, 112b position the bearing plate 100 on a V-notch mounting block 150 (FIG. 6) to positionally reference the bearing plate 100 and the photoconductor drum 20 to a toner receiving surface. As shown in FIG. 8, in some embodiments, the positioning surfaces 112a, 112b are arcuate and defined by a radius from the center axis 107 of the center hole 106 to positionally reference the positioning surfaces 112a, 112b to the center axis 107. Embodiments include those wherein the positioning surfaces 112a, 112b are zero-draft surfaces as is known in the art. In some embodiments the centers of positioning surfaces 112a, 112b are separated from one another by about 90 degrees along the edge surface 104c. As illustrated, the positioning surfaces 112a, 112b have their respective inner edges being arcuately separated by a first distance R1 of about 74.7 degrees with their respective outer edges being arcuately separated by a second distance R2 of about 105.3 degrees. Embodiments include those wherein a radial distance A from the center axis 107 of the center hole 106 to each of the positioning surfaces 112a, 112b is between about 15.0 mm and 16.0 mm and is preferably about 15.5 mm.

Some embodiments include a cutout 128 in the edge surface 104c positioned orthogonal to the center hole 106 and between the positioning surfaces 112a, 112b. The cutout 128 allows the pin 34 to be inserted into the corresponding radial hole 32 through the center shaft 24. In some embodiments, a pair of guide members 130a, 130b project axially outwardly from the first side 104a of the bearing 100b. The guide members 130a, 130b are radially positioned between the cutout 126a in the boss 124 and the cutout 128 in the edge surface 104c. The guide members 130a, 130b are positioned to direct the pin 34 toward the radial hole 32 during assembly. For ease of assembly and manufacturing and minimization of tolerance both bearing plates 100a, 100b are substantially identical to one another. For example, bearing 100a has guide members and cutouts like those found on bearing plate 100b.

Figure 6:
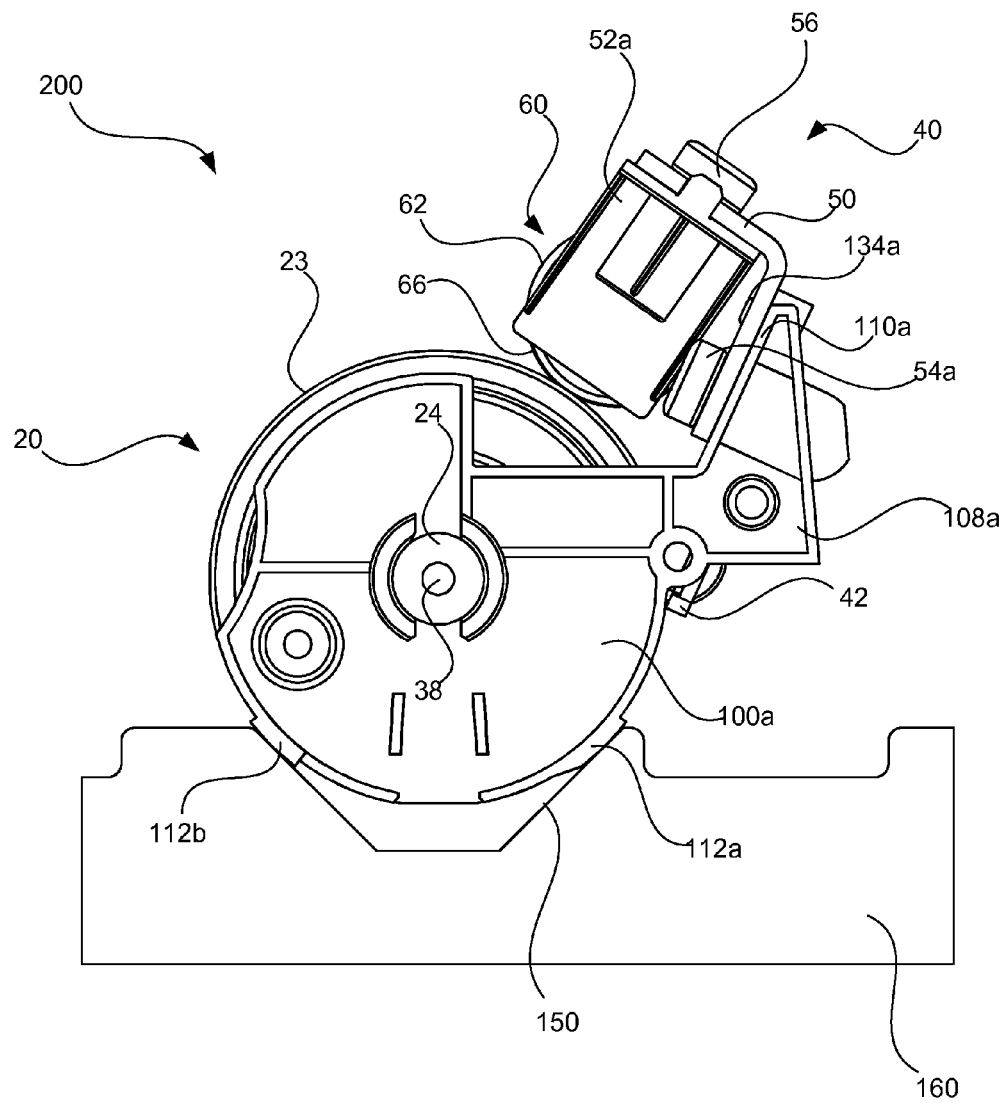
FIG. 6 is a side elevation view of an assembly for use in an image forming device according to one embodiment of the present invention.

FIG. 6 shows an assembly 200 viewed in elevation from bearing plate 100a for use in an image forming device that includes a photoconductor drum assembly 20, a cleaner assembly 40 and a charge roller assembly 60. The bearing plates 100a, 100b and the photoconductor drum 20 are mounted in the housing 160 of the imaging apparatus in respective opposed V-notches on a V-notch mounting block 150. However, it will be understood by those having skill in the art that the photoconductor drum 20 and any toner cartridge that it resides in can be mounted in or to an imaging apparatus by any suitable means.

The cleaner assembly 40 includes a cleaner blade 42 mounted to the support arms 108a, 108b. The cleaner blade 42 is biased radially against the outer surface 23 of the photoconductor drum 20 to remove toner from the outer surface 23 of the photoconductor drum 20. The photoconductor drum 20 interferes with an edge 44 of the cleaner blade 42 such that the cleaner blade 42 is deflected by the photoconductor drum 20. The cleaner blade 42 is preferably resilient in order to maintain proper contact with the outer surface 23 of the photoconductor drum 20. The cleaner blade 42 can also be electrically charged to attract toner particles. As shown in FIG. 6, the photoconductor drum 20 would be rotating in an anti-clockwise direction so that the outer surface 23 of photoconductive drum 20 is first cleaned by cleaner blade 42, then charged by charge assembly 60 and then exposed to the laser beam to form the latent image.

The charge roller assembly 60 includes a charge roller 62 having a center shaft 64 that is mounted to the support arms 108a, 108b extending from the bearing plates 100a, 100b. The charge roller 62 extends axially across and parallel to the outer surface 23 of photoconductor drum 20. An outer surface 66 of the charge roller 62 contacts the outer surface 23 of the photoconductor drum 20 to electrically charge the outer surface 23 of the photoconductor drum 20. It is preferred that the contact between the outer surface 66 of the charge roller 62 and the outer surface 23 of the photoconductor drum 20 be uniform across the length of both components. Having both the outer surface 23 of the photoconductor drum 20 and the outer surface 66 of the charge roller 62 reference to the center axis 107 of the bearing plates 100a, 100b, ensures uniform contact.

In some embodiments, a bracket 50, which is illustrated as being L-shaped, is mounted to the respective mounting surfaces 110a, 110b of each support arm 108a, 108b. The bracket 50 is typically made from steel. The charge roller 62 is mounted to the bracket 50. The charge roller 62 may be mounted directly to the bracket 50. Alternatively, the charge roller 62 may be mounted to the bracket 50 via intermediate spring biased mounting means such as additional brackets or retaining members. The cleaner blade 42 extends from the bracket 50 toward the photoconductor drum 20. The cleaner blade 42 may extend directly from the bracket 50. Alternatively, the cleaner blade 42 may be mounted to the bracket 50 via intermediate mounting means such as additional brackets or retaining members. The bracket 50 is positioned to optimize the alignment of the charge roller 62 and the cleaner blade 42. The alignment device 114a, 114b on the mounting surface 110a, 100b of each support arm 108a, 108b is cooperatively engaged with a respective end of the bracket 50 to position the charge roller 62 and the cleaner blade 42 relative to the center axis 38 of the center shaft 24 of the photoconductor drum 20. The center axis 38 extends between the center of each center hole 106 and along the centerline of the center shaft 24. In the exemplary embodiment shown, a screw 54a, 54b passes through a respective first hole 58a, 58b on a respective end of bracket 50 (FIG. 7) and into the respective screw hole 132a, 132b to mount the bracket 50 to the mounting surfaces 110a, 110b. Further, the peg 134a, 134b passes through a respective second hole 59a, 59b on a respective end of the bracket 50 (FIG. 7) to align the bracket 50 and the attached components with the center axis 38 of the center shaft 24.

Figure 7:
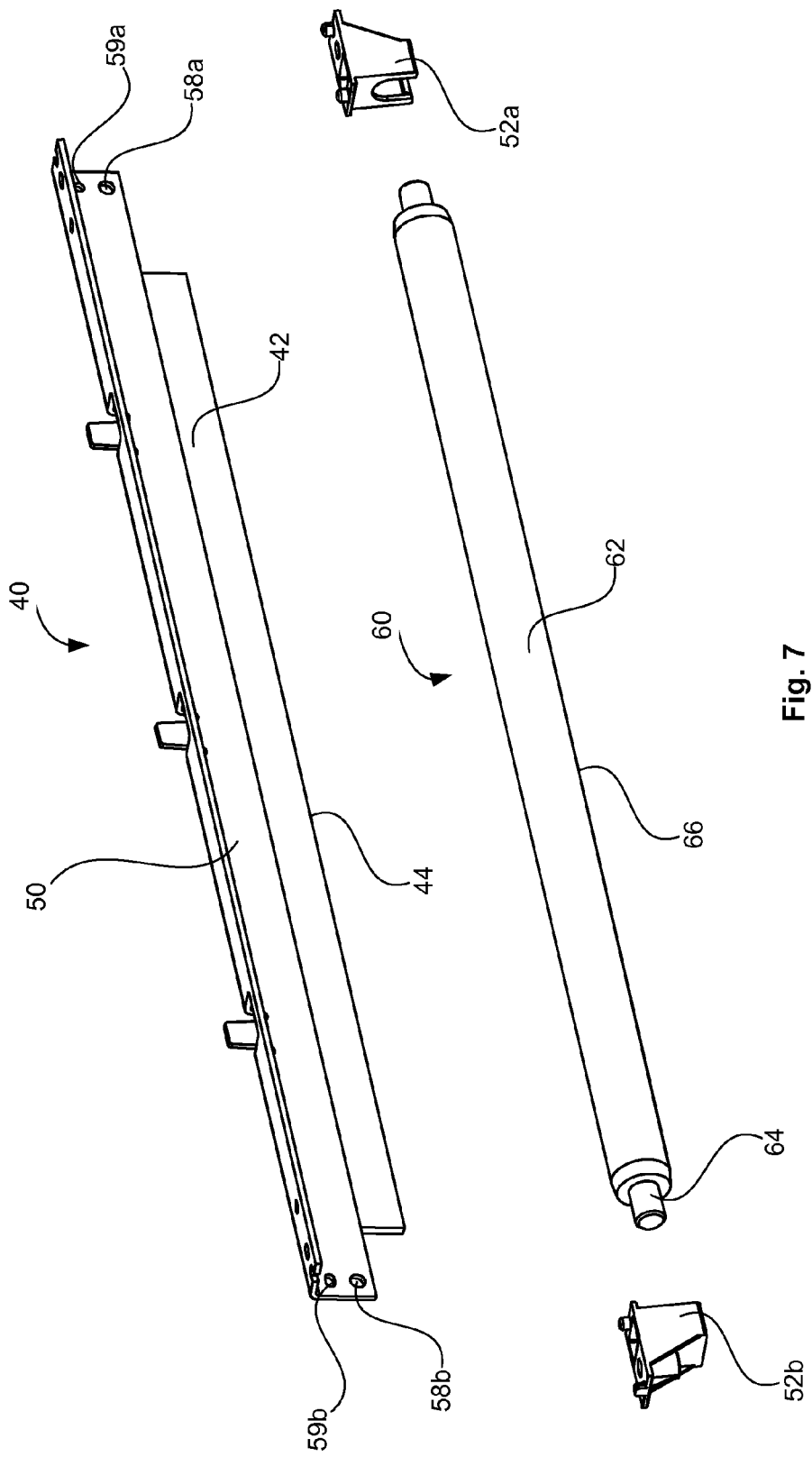
FIG. 7 is an exploded view of a cleaner assembly and a charge roller assembly according to one embodiment of the present invention.

With reference to FIG. 7, in some embodiments a pair of spring loaded retaining members 52a, 52b are mounted on the bracket 50. The retaining members 52a, 52b receive a respective end of the center shaft 64 of the charge roller 62. However, one skilled in the art will appreciate that the charge roller 62 may be mounted using any suitable means. The retaining members 52a, 52b bias the charge roller 62 against the outer surface 23 of photoconductor drum 20. In the exemplary embodiment shown, the retaining members 52a, 52b are mounted to the bracket 50 with a screw 56 (FIG. 6). However, one skilled in the art will appreciate that any suitable mounting means may be used.

In the exemplary embodiment shown in FIG. 7, the cleaner blade 42 is mounted on the bracket 50. The cleaner blade 42 may be attached to the bracket 50 by any suitable means including, for example, adhesives, screws, fasteners, etc. In the exemplary embodiment shown, the cleaner blade 42 is glued to the bracket 50 in a cantilevered fashion. In this configuration, the glue is applied across the length of the cleaner blade 42 to form a seal to prevent toner from escaping between the cleaner blade 42 and the bracket 50.

With reference to FIG. 8, multiple embodiments include those wherein the cleaner blade 42, the charge roller 62, the toner receiving surface 170 and the positioning surfaces 112*a*, 112*b* are positionally referenced to the center axis 38 of the center shaft 24 of the photoconductor drum 20. Where the charge roller 62 is center-referenced to the photoconductor drum 20, a radial distance C from the center axis 65 of the center shaft 64 of the charge roller 62 to the center axis 38 of the center shaft 24 of the photoconductor drum 20 is about 20.5 mm to about 21.5 mm and is preferably about 20.91 mm.

FIG. 8 illustrates the cleaner blade 42 biased radially against the outer surface 23 of the photoconductor drum 20. This contact between the cleaner blade 42 and the photoconductor drum 20 causes the flexible cleaner blade 42 to bend slightly as shown. When no contact exists between the cleaner blade 42 and the outer surface 23 of the photoconductor drum 20, i.e., when the photoconductor drum 20 is removed, a radial distance D from the center axis 38 of the center shaft 24 to an edge 44 of the cleaner blade 42 is less than a radial distance B from the center axis 38 of the center shaft 24 to the outer surface 23 of the photoconductor drum 20. Radial distance B is typically between about 14.5 mm and 15.5 mm and is preferably about 15.0 mm. Radial distance D is typically between about 13.5 mm and 14.0 mm and is preferably about 13.77 mm.

In some embodiments, the toner receiving surface 170 is deflected by the contact with the outer surface 23 of the photoconductor drum 20. This ensures that contact is maintained between the toner receiving surface 170 and the outer surface 23 of the photoconductor drum 20 during toner transfer. When no contact exists between toner receiving surface 170 and the outer surface 23 of the photoconductor drum 20, i.e., when the photoconductor drum 20 is removed, a radial distance E from the center axis 38 of the center shaft 24 to the toner receiving surface 170 is less than the radial distance B from the center axis 38 of the center shaft 24 to the outer surface 23 of the photoconductor drum 20.

The present invention addresses the problem of AC print registration problems by center referencing the photoconductor drum 20 with respect to the bearing plates 100*a*, 100*b*. The problem of skew is corrected by identically orienting the bearing plates 100*a*, 100*b* in a spaced relationship. Testing has shown this structure to be much less susceptible to AC process print registration problems and much less susceptible to skew of the drum such that electronic correction is not needed.

The foregoing description of an embodiment of the invention has been presented for purposes of illustration. It is not intended to be exhaustive or to limit the invention to the precise forms disclosed, and obviously many modifications and variations are possible in light of the above teaching. It is understood that the invention may be practiced in ways other than as specifically set forth herein without departing from the scope and essential characteristics of the invention. It is intended that the scope of the invention be defined by the claims appended hereto.

What is claimed is:

1. A bearing plate for rotably supporting a photoconductor drum having a center shaft, comprising:
   a body having a first side, a second side, an edge surface between the first and second sides, and a center hole extending through the body for rotably receiving an end of the center shaft and positionally referencing an outer surface of the photoconductor drum to a center axis of the center hole;
   a support arm extending from the edge surface in a non-radial direction having a mounting surface for mounting a roller having a center shaft positionally referenced to the center axis and a cleaner blade positionally referenced to the center axis; and
   an alignment device formed on the mounting surface of the support arm for cooperatively engaging with the roller and cleaner blade and aligning the roller and cleaner blade to the center axis.

2. A bearing plate for rotably supporting a photoconductor drum having a center shaft, comprising:
   a body having a first side, a second side, an edge surface between the first and second sides, and a center hole extending through the body for rotably receiving an end of the center shaft and positionally referencing an outer surface of the photoconductor drum to a center axis of the center hole;
   a support arm extending from the edge surface in a non-radial direction having a mounting surface for receiving an additional component positionally referenced to the center axis; and
   a first positioning surface and a second positioning surface extending radially from the edge surface for positioning the bearing plate on a V-notch mounting block, the bearing plate being positionally referenced to a toner receiving surface.

3. The bearing plate of claim 2, wherein the first positioning surface and the second positioning surface are arcuate, defined by a radius from the center axis of the center hole and positionally referenced to the center axis.

4. The bearing plate of claim 3, wherein a radial distance from the center axis to each of the first positioning surface and the second positioning surface is about 15.5 mm.

5. The bearing plate of claim 2, wherein the first positioning surface and the second positioning surface have substantially no draft across a width of each positioning surface.

6. An assembly for use in an image forming device, comprising:
   a photoconductor drum having a center shaft; and
   a pair of substantially identical bearing plates mounted on opposite ends of the photoconductor drum, the bearing plates being translated from one another and having substantially identical orientations, each bearing plate having a center hole therein for rotably receiving a respective end of the center shaft and positionally referencing an outer surface of the photoconductor drum to a center axis extending between the center of each center hole and along the centerline of the center shaft, wherein each bearing plate includes a body having a first side, a second side, an edge surface between the first and second sides, and a support arm extending from the edge surface in a non-radial direction and having a mounting surface for receiving an additional component positionally referenced to a center axis of the center shaft; and
   the additional component including a charge roller having a center shaft, the charge roller being mounted to the support arms, extending axially across the photoconductor drum and having an outer surface in contact with the outer surface of the photoconductor drum for electrically charging the outer surface of the photoconductor drum.

7. The assembly of claim 6, further comprising a cleaner blade mounted to the support arms extending axially across the photoconductor drum and biased against the outer surface of the photoconductor drum for removing toner from the outer surface of the photoconductor drum.

8. The assembly of claim 7, further comprising:
a bracket mounted to the mounting surface of each support arm, the charge roller being mounted to the bracket and the cleaner blade extending from the bracket toward the photoconductor drum; and
an alignment device on the mounting surface of each support arm cooperatively engaged with a respective end of the bracket for positioning the charge roller and the cleaner blade relative to the center axis of the center shaft of the photoconductor drum.

9. The assembly of claim 8, wherein each bearing plate includes a first positioning surface and a second positioning surface extending radially from the edge surface for positioning each bearing plate on a V-notch mounting block, each bearing plate being positionally referenced to a toner receiving surface.

10. The assembly of claim 9, wherein a first radial distance from the center axis of the center shaft of the photoconductor drum to an edge of the cleaner blade in contact with the outer surface of the photoconductor drum is less than a second radial distance from the center axis of the center shaft of the photoconductor drum to the outer surface of the photoconductor drum when no contact exists and a third radial distance from the center axis of the center shaft of the photoconductor drum to an adjacent surface of the toner receiving surface in contact with the outer surface of the photoconductor drum is less than the second radial distance when no contact exists.

11. The assembly of claim 10, wherein the first radial distance is about 13.77 mm when no contact exists between the edge of the cleaner blade and the photoconductor drum, the second radial distance is about 15 mm, the third radial distance is less than about 15 mm when no contact exists between the toner receiving surface and the photoconductor drum, and a fourth radial distance from the center axis of the center shaft of the photoconductor drum to a center axis of the center shaft of the charge roller is about 20.91 mm.

12. The assembly of claim 8, further comprising a pair of spring loaded retaining members for biasing the charge roller against the photoconductor drum, each retaining member being mounted on a respective end of the bracket and receiving a respective end of the center shaft of the charge roller.

13. A bearing plate for rotably supporting a photoconductor drum having a center shaft, comprising:
a body having a first side, a second side, an edge surface between the first and second sides, and a center hole extending through the body for rotably receiving an end of the center shaft and positionally referencing an outer surface of the photoconductor drum to a center axis of the center hole;
a support arm extending from the edge surface in a non-radial direction having a mounting surface for receiving an additional component positionally referenced to the center axis;
a boss extending from the first side of the body adjacent to the center hole; and
a cutout in the boss orthogonal to the center hole for allowing a cross pin to be inserted into a corresponding radial hole through the center shaft.

14. The bearing plate of claim 13, further comprising a cutout in the edge surface orthogonal to the center hole for allowing the cross pin to be inserted into the radial hole.

15. The bearing plate of claim 14, further comprising a plurality of guide members aligned between the cutout in the edge surface and the cutout in the boss and extending from the first side of the body for directing the cross pin toward the radial hole.

16. A bearing plate for rotably supporting a photoconductor drum having a center shaft, comprising:
a body having a first side, a second side, an edge surface between the first and second sides, and a center hole extending through the body for rotably receiving an end of the center shaft and positionally referencing an outer surface of the photoconductor drum to a center axis of the center hole;
a support arm extending from the edge surface in a non-radial direction having a mounting surface for mounting a roller having a center shaft positionally referenced to the center axis and a cleaner blade positionally referenced to the center axis;
a notch in the edge surface in an upper section of the body adjacent to the support arm having a floor, the mounting surface of the support arm extending from the floor of the notch and forming an obtuse angle with the floor of the notch; and
a wall extending upward from the floor of the notch opposite the mounting surface of the support arm.

* * * * *